United States Patent
Bowen et al.

[11] Patent Number: 5,841,736
[45] Date of Patent: Nov. 24, 1998

[54] LOW VOLTAGE PIEZOELECTRIC TRANSDUCER AND METHOD

[75] Inventors: Leslie J. Bowen, Concord; Craig D. Near, Acton, both of Mass.

[73] Assignee: Materials Systems Incorporated, Littleton, Mass.

[21] Appl. No.: 847,435

[22] Filed: Apr. 28, 1997

[51] Int. Cl.$^6$ .............................. H04R 17/00; H01L 41/08
[52] U.S. Cl. ........................... 367/140; 310/334; 310/358; 310/367; 310/369
[58] Field of Search ...................................... 367/155, 157, 367/159, 140; 310/334, 358, 367, 369

[56] References Cited

U.S. PATENT DOCUMENTS

| | | | |
|---|---|---|---|
| 5,173,605 | 12/1992 | Hayes et al. | 310/332 |
| 5,598,050 | 1/1997 | Bowen et al. | 310/322 |

*Primary Examiner*—Ian J. Lobo
*Attorney, Agent, or Firm*—Frances P. Craig

[57] ABSTRACT

A transducer including a ceramic body having a base and an array of tube-shaped piezoelectric or electrostrictive ceramic elements integral with the base. A first electrode contacts the tube wall inner surface, while a second electrode contacts the tube wall outer surface and is electrically isolated from the first electrode and from the lower surface of the transducer. The first electrode extends onto the transducer lower surface for electrical connection to a power source for driving the transducer across the tube walls for $d_{31}$ mode vibration of the tube walls. A stiff cover plate may be used to transmit the tube wall vibration to a desired medium. The ceramic base may be removed if an electrically insulating layer is provided between the elements at the lower surface of the transducer. The insulating layer and tube wall upper edges then electrically isolate the second electrode from the first electrode and the transducer lower surface. In this alternative, the first and second electrodes are provided by a stiff conductive polymer matrix filling the tube-shaped elements and spaces between the elements. The matrix upper surface transmits the tube wall vibration to a desired medium without a cover plate. The first electrode extends onto the composite body lower surface for electrical connection to a source of electric power for driving the transducer across the tube walls for $d_{31}$ mode vibration of the tube walls. A net-shape molding method for producing the transducer is also described.

9 Claims, 4 Drawing Sheets

LOW VOLTAGE PIEZOELECTRIC TRANSDUCER AND METHOD

GOVERNMENT CONTRACT INFORMATION

The Government of the United States of America has certain rights in this invention pursuant to Contract No. N00014-95-C-0353, awarded by or for the U.S. Department of the Navy.

CROSS-REFERENCE TO RELATED APPLICATIONS

The present application contains subject matter related to U.S. provisional patent applications Ser. Nos. 60/022,634 and 60/033,316 and to U.S. Pat. Nos. 5,340,510 and 5,598,050, all commonly assigned herewith. Application Ser. Nos. 60/022,634 and 60/033,316 and U.S. Pat. Nos. 5,340,510 and 5,598,050 are incorporated herein by reference.

BACKGROUND OF THE INVENTION

The present invention relates to piezoelectric transducers. The invention particularly relates to piezoelectric transducers having hollow tube-shaped elements and to a net shape process for fabricating these transducers.

Above-referenced U.S. Pat. No. 5,340,510 discloses a 1–3 composite transducer made up of an array of very fine piezoelectric or electrostrictive ceramic rod-shaped elements in a polymer matrix. This composite transducer has been a great improvement over the prior art, but further improvement is desired for low-voltage operation.

Particularly promising for such a low-voltage transducer is a configuration substituting ceramic tubes for the rod-shaped elements of U.S. Pat. No. 5,340,510. The advantages of utilizing tubes as elements instead of solid ceramic rods in such a transducer is that the tubes can be poled and driven by a relatively low voltage applied across the wall thickness of the tubes, while a high mechanical displacement can be obtained along the tube length direction. This arrangement uses the $d_{31}$ piezoelectric coefficient to actuate the tube elements, whereas in a conventional 1–3 piezoelectric composite such as that disclosed in U.S. Pat. No. 5,340,510 the higher $d_{33}$ coefficient is used. Even though the $d_{33}$ piezoelectric coefficient is higher than the $d_{31}$ coefficient, the tube array transducer can be made to operate at a very low voltage by suitably reducing the ceramic tube wall thickness, which is a great advantage in many applications. Additionally, the tube length displacement can be increased, independently of the applied voltage, by increasing the tube length while keeping the wall thickness constant.

Prior to the present invention, attempts to reliably fabricate such transducers, particularly the large area transducers required for, e.g., military applications, at reasonable cost using arrays of tube-shaped ceramic piezoelectric elements have not met with much success. Part of the increased cost and difficulty lies in the need to fabricate piezoelectric or electrostrictive ceramic materials as tube-shaped elements and in the electroding of the tube walls. The other major cost factor is that of electrically connecting the tubes either collectively in parallel or individually as separate elements in a two dimensional (2D) array. Fabricating piezoelectric ceramic transducers having complex element geometries and layouts requires new approaches to the design of the transducer elements and to ceramic and polymer forming to achieve relatively low cost and large area manufacturability.

U.S. Pat. No. 5,340,510 also discloses a net shape molding process for producing the 1–3 composite disclosed therein. The process involves mixing a piezoelectric or electrostrictive ceramic powder with a thermoplastic organic binder, forming a ceramic green body by injection molding the mixture into a mold which is the negative of the desired rod array configuration mounted on an integral ceramic base, removing the binder from the green body, and sintering the body to full density. The body is then encapsulated in a polymer matrix and the supporting base is removed leaving a sheet-shaped composite body. The composite body then is electroded on its planar upper and lower surfaces to produce the transducer. This process produces a composite transducer at reasonable cost, but the operating voltage of such a transducer is limited by the geometry of the rods fabricable by such a process.

Accordingly, it is an object of the present invention to provide a transducer which overcomes the disadvantages of the prior art.

It is another object of the invention to provide a transducer which utilizes a hollow ceramic tube geometry with voltage across the tube wall to produce vibration in the wall of the tube along its length dimension ($d_{31}$ mode), and in which the electrode outside the tube walls is electrically isolated from the lower surface of the transducer, so that electrical connection of the electrode inside the walls of the individual tubes to a source of electrical power may be readily and cost effectively accomplished.

It is yet another object of the invention to provide such a transducer which is readily and cost effectively produced by a net-shape molding technique.

It is yet another object of the invention to provide such a transducer including a stiff cover plate bonded to the upper edges of the tubes for transmitting the tube wall vibration to a desired medium.

It is yet another object of the invention to provide such a transducer in which a stiff polymer matrix, bonded to, filling, and surrounding the tubes, replaces the cover plate for transmission of the tube wall vibration to a desired medium.

It is yet another object of the invention to provide such a transducer in which the stiff polymer matrix is conductive and provides the inner and outer electrodes of the transducer.

It is yet another object of the invention to provide such a transducer in which the tubes are bonded to or are unitary with a stiff base plate on the tube ends opposite to the cover plate.

It is a further object of the invention to provide a net-shape molding process for producing a transducer which utilizes a hollow ceramic tube geometry with voltage across the tube wall to produce vibration in the wall of the tube along its length dimension, and in which the electrode outside the tube walls is electrically isolated from the lower surface of the transducer, so that electrical connection of the electrode inside the walls of the individual tubes to a source of electrical power may be readily and cost effectively accomplished.

SUMMARY OF THE INVENTION

In accordance with these objects, the invention is a transducer and a net-shape molding method for producing the transducer in which the individual elements are tube shaped and are driven by electrodes outside and inside the walls of the tubes across the thickness of the tube walls for $d_{31}$ mode vibration along the tube length. The electrode outside the tube walls is electrically isolated from the lower surface of the transducer, so that electrical connection of the electrode inside the walls of the individual tubes to a source of electrical power may be readily and cost effectively accomplished. In some embodiments, a cover plate extending over the upper edges of the tubes and bonded thereto is used to transmit the vibration of the tube walls to a desired medium. The transducer is fabricated from a piezoelectric or electrostrictive ceramic material by netshape molding of a moldable, homogeneous, granulated, thermoplastic powder-binder mixture including a ceramic powder and a thermoplastic organic binder.

In one aspect the invention is a transducer including a composite body having an upper generally planar surface and a lower generally planar surface. The composite body includes a ceramic body including a base having a lower surface, and an array of parallel, hollow, tube-shaped ceramic transducer elements of a strongly piezoelectric or electrostrictive ceramic material. The tube-shaped elements are integral with and extend perpendicularly from the base, are fixedly supported in the array by the base, and have tube walls each having an outer surface, an inner surface, and an upper edge. The composite body also includes a first electrically conductive electrode contacting the tube wall inner surface and a second electrically conductive electrode contacting the tube wall outer surface and electrically isolated from the first electrode and from the base lower surface. The first electrode extends onto the base lower surface for electrical connection to a source of electric power for driving the transducer across the tube walls for $d_{31}$ mode vibration of the tube walls.

In another aspect, the invention is a transducer including a composite body having an upper generally planar surface and a lower generally planar surface. The composite body includes an array of parallel, hollow, tube-shaped ceramic transducer elements of a strongly piezoelectric or electrostrictive ceramic material. The tube-shaped elements have tube walls each having an outer surface, an inner surface, and an upper edge. The composite body also includes a first electrically conductive electrode contacting said tube wall inner surface, a second electrically conductive electrode contacting said tube wall outer surface, and an electrically insulating layer at the composite body lower surface between the elements. The insulating layer and tube wall upper edges electrically isolate the second electrode from the first electrode and the composite body lower surface. The first and second electrodes are provided by a stiff, electrically conductive polymer matrix filling the tube-shaped elements and spaces between the elements and bonded to the elements. An upper surface of the matrix is coplanar with the tube wall upper edges to provide the composite body upper surface for transmitting vibration of the tube walls to a desired medium. The tube wall upper edges are exposed at the body upper surface. The first electrode extends onto the composite body lower surface for electrical connection to a source of electric power for driving the transducer across the tube walls for $d_{31}$ mode vibration of the tube walls.

In yet another aspect, the invention is a net-shape process for fabricating a transducer including a composite body having an upper generally planar surface and a lower generally planar surface. The process includes preparing a homogeneous, granulated, thermoplastic powder-binder mixture including a strongly piezoelectric or electrostrictive ceramic powder and sufficient thermoplastic organic binder to render the mixture moldable by an injection or compression molding technique. The binder is selected to render the mixture moldable by the molding technique and to be non-destructively removed from the mixture by heating. A green body of the mixture is formed by injection or compression molding the mixture in a molding apparatus including a mold which is at least in part a negative of a ceramic component of the transducer. The green body includes a planar ceramic base and a plurality of parallel, hollow, tube-shaped ceramic transducer elements integral with and extending perpendicularly from the base in an array and fixedly supported in the array by the base. The tube-shaped elements have walls having an outer surface, an inner surface, and an upper edge. The green body is cooled in the mold sufficiently to be releasable from said mold as a self-supporting green body, then is released from the mold. The self supporting green body is heated to a temperature and for a time selected to non-destructively remove the binder from the green body. The body is sintered at a temperature and for a time sufficient to fully densify the body. A first electrically conductive electrode is deposited on said fully densified body to contact the tube wall inner surface, and a second electrically conductive electrode is deposited on said body to contact the tube wall outer surface. The second electrode is electrically isolated from the first electrode and from the transducer lower surface. The ceramic body is poled, before or after depositing the electrodes, to achieve a $d_{31}$ piezoelectric orientation in the tube walls. The first electrode extends onto the body lower surface for electrical connection to a source of electric power for driving the transducer across the tube walls for $d_{31}$ mode vibration of the tube walls. In a narrower aspect, the ceramic base is removed while the electrical isolation of the second electrode from the first electrode and the transducer lower surface is maintained.

BRIEF DESCRIPTION OF THE DRAWINGS

For a better understanding of the present invention, together with other objects, features, advantages, and capabilities thereof, reference is made to the following Description and appended Claims, together with the Drawing in which:

DETAILED DESCRIPTION OF THE PREFERRED EMBODIMENTS

Figure 1:
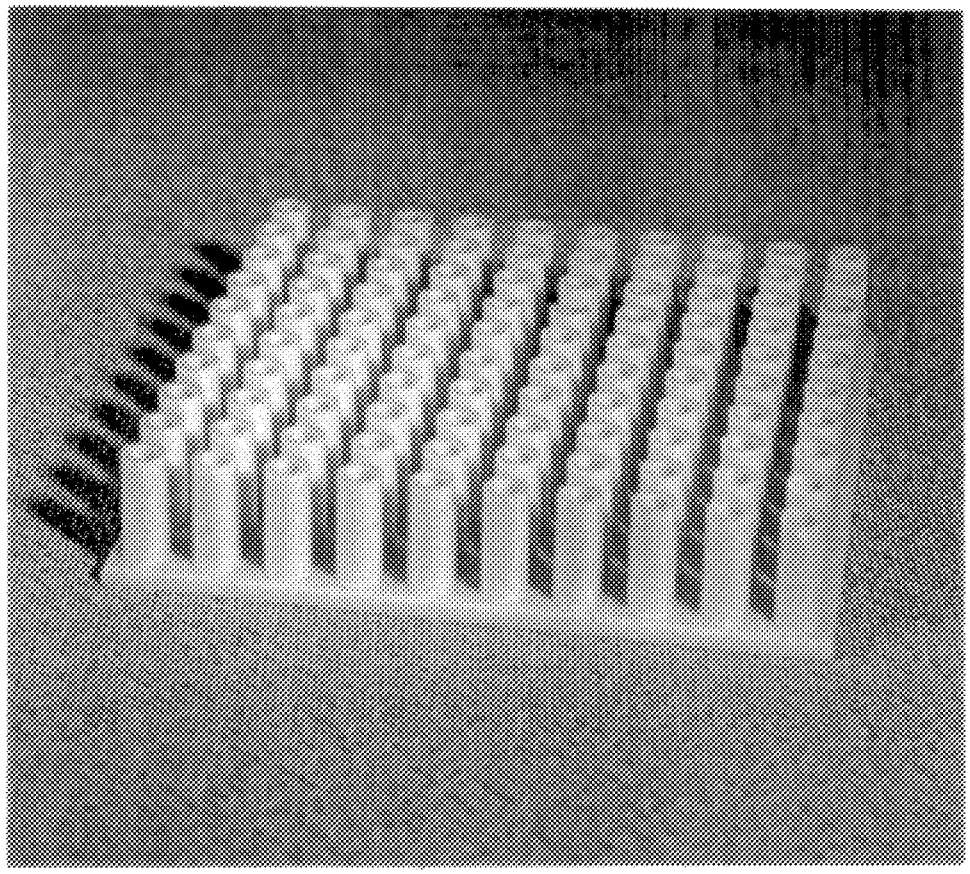
FIG. 1 is a photograph of a piezoelectric ceramic body in which ceramic tubes extend from a unitary ceramic base, the body having been fabricated by the net shape molding process in accordance with one embodiment of the present invention.

The description below of various illustrative embodiments shown in the Drawings is not intended to limit the scope of the present invention, but merely to be illustrative and representative thereof.

In one exemplary embodiment, shown in FIG. 1, a piezoelectric ceramic tube-type transducer is produced by injection molding or compression molding a ceramic green body from a mixture of a ceramic powder and a thermoplastic organic binder. The binder is removed from the blank in a conventional manner and the binder-removed blank is sintered to produce a sintered body having an array of parallel, hollow ceramic tubes extending upward from a ceramic base unitary with and interconnecting the tubes. The cylindrical openings through the center of the tubes extend through the base to the lower surface of the base.

The ceramic body shown in FIG. 1 is 50×50 mm square with 100 tubes in the array, but larger or smaller ceramic bodies are within the invention, e.g., bodies 10–100 mm on a side and having 1–10,000 tubes in the array. The tubes typically are 0.5–10 mm in diameter, 1–100 mm long, and spaced apart by 0.5–10 mm. The wall thickness of the tubes should be as thin as it is possible to mold them for low voltage operation, with a preferred maximum thickness of 5 mm.

The ceramic powder is a highly piezoelectric or electrostrictive ceramic material such as lead zirconate titanate, lead magnesium niobate, barium titanate, lead titanate, strontium titanate, bismuth titanate, or their admixtures or derivatives. The ceramic material may be, but not necessarily is doped with a fraction of a percent of a conventional donor or acceptor component to enhance its piezoelectric properties or to tailor its properties to suit the intended application. Typical dopants include iron, niobium, barium, lanthanum, and other elements. The ceramic powder typically is added to the binder at a high solids loading, e.g., greater than 50 volume %.

The binder is selected to provide with the powder a hot thermoplastic mixture suitable for injection molding or for compression molding, and to be removed by slow heating with no residue deleterious to the fabrication process or the piezoelectric properties of the ceramic. Examples of suitable binders include waxes, such as paraffin wax, and thermoplastics such as polyethylene or polypropylene. The mixture may be cooled and granulated before molding.

The blank may be molded by injection molding of the hot ceramic-binder mixture into a cooler, closed mold, the mold being cooled to a temperature sufficient to solidify the mixture. The mold halves, or inserts therein, together are the negative of the desired tube array blank. The blank is then ejected from the mold. This method is similar to that described in U.S. Pat. No. 5,340,510, incorporated herein by reference.

Alternatively, the blank may be compression molded by forming a green ceramic preform shaped from the above-described hot ceramic-binder mixture, and placing the preform between upper and lower mold halves of a heated compression molding apparatus. The molding temperature should be slightly higher than the softening temperature of the ceramic-binder mixture. The mold halves, or inserts therein, together are the negative of the desired tube array blank. The heated mold halves are brought together with pressure sufficient to deform the preform at the selected mold temperature, forcing protrusions on the mold halves to penetrate the preform. The displaced material of the preform flows into the mold cavity between the protrusions, forming a green ceramic blank having the desired shape of an array of tubes on a supporting base. After cooling, the molded blank is removed from the mold.

In either method, the binder is nondestructively removed from the molded blank by slow binder removal over a period of 1–100 hours. Nondestructive binder removal is aided by the high solids loading in the mixture. Once the binder is removed, the ceramic body is fired (sintered) and poled in a conventional manner to achieve a fully dense (at least 93% of theoretical density) ceramic body poled in a $d_{31}$ mode.

The sintered body is electroded at least outside and inside the tube walls by applying an electrically conductive coating on all surfaces of the sintered body, then separating the electrodes by removing a portion of the coating or, alternatively, by masking the area over which the electrodes are to be separated before the coating is applied. The conductive coating may be metal, e.g., silver, gold, palladium, or nickel, or a conventional conductive polymer. The coating is preferably applied by sputtering, chemical or physical vapor deposition, electroless plating, or dipping in a conductive solution, all of which processes are well known in the art. In some embodiments of the process, a cover plate is bonded to the upper edges of the tubes to transmit the vibration of the tube walls of the transducer to a desired medium. The electroding and cover plate are described in more detail below. In each embodiment, however, The electrode outside the tube walls is electrically isolated from the lower surface of the transducer, so that this lower surface may be utilized for simple and cost effective connection of the electrode(s) inside of the tube walls to a source of electrical power.

Figure 2:
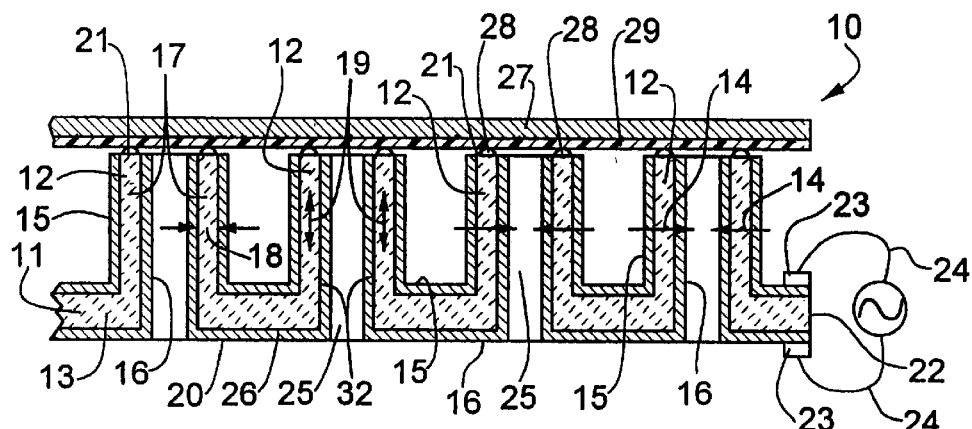
FIG. 2 is a cross-sectional elevation view of a portion of a transducer in accordance with another embodiment of the invention.

An illustrative transducer is shown in FIG. 2. Transducer 10 includes piezoelectric ceramic body 11, similar to the sintered ceramic body shown in FIG. 1. Body 11 is made up of an array of a plurality of ceramic tubes 12 extending from ceramic base 13 in a direction normal to the plane of the base. Base 13 interconnects tubes 12 to one another and acts to support and stiffen the transducer. Using the net-shape forming process described above, piezoelectric or electrostrictive ceramic tubes may be co-formed with this supporting ceramic base. Base 13 also provides a simple and cost effective means for electroding the transducer, as described below. Tubes 12 are poled, as shown by arrows 14, in a direction across the thickness of the tube walls.

Electrodes 15 and 16 are provided on the outer and inner surfaces, respectively, of tube walls 17 for driving the tube walls across their thickness 18, causing vibration in the tube walls in a direction normal to the plane of base 13, as shown by arrows 19. In this embodiment the electrodes also cover the troughs between tubes and the base lower surface respectively. These electrodes are applied by coating the entire sintered ceramic body of FIG. 1 with conductive coating 20, removing or masking the portions of coating 20 covering all of tube upper edges 21 and all around base outer edge 22 to electrically isolate electrode 15 from electrode 16. Electrodes 15 and 16 are connected to a source of electrical power by conventional means, e.g., via contacts 23 and wires 24

As is illustrated in FIG. 2, the geometry of the ceramic body of FIG. 1 provides a ready and cost effective means of electroding the transducer, which until the present invention has been an difficult problem. Cylindrical openings 25 extend completely through ceramic body 11 from upper tube edges 21 to lower surface 26 of base 13. Inner electrode 16 extends through each tube 12, coating openings 25, and over lower surface 26, permitting versatility in electroding and driving the transducer without complicated wiring or undue cost. The tubes may be driven collectively using a single, common electrode 16. Alternatively, the portion of electrode 16 covering lower surface 26 of base 13 may be etched, masked, or otherwise patterned to isolate the tubes or groups of the tubes from one another. Separate contacts may be attached at lower surface 26 to drive sections of the transducer independently from one another.

Figure 3:
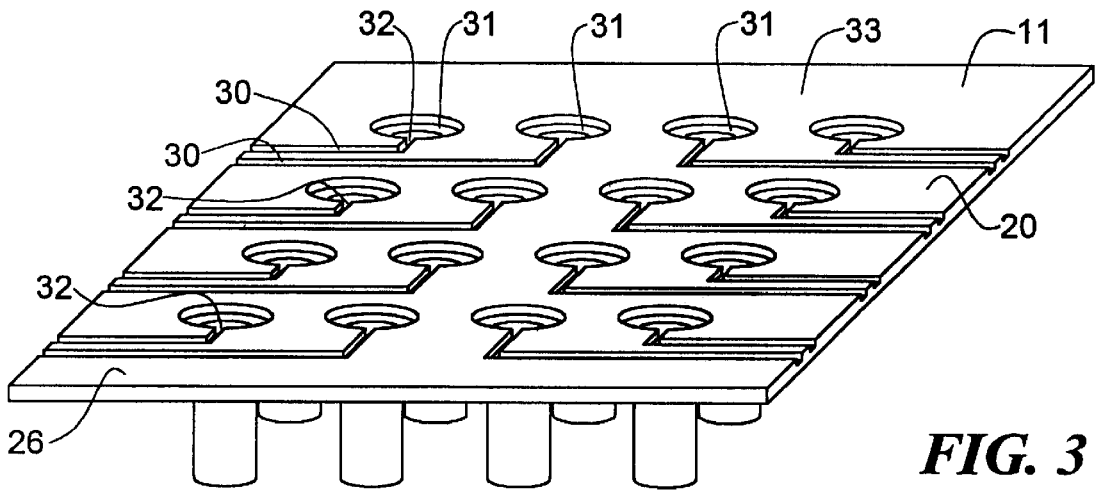
FIG. 3 is a perspective view of a piezoelectric ceramic body similar to that shown in FIG. 1 and having a pattern of grooves machined therein and a conductive coating thereon.
Figure 4:
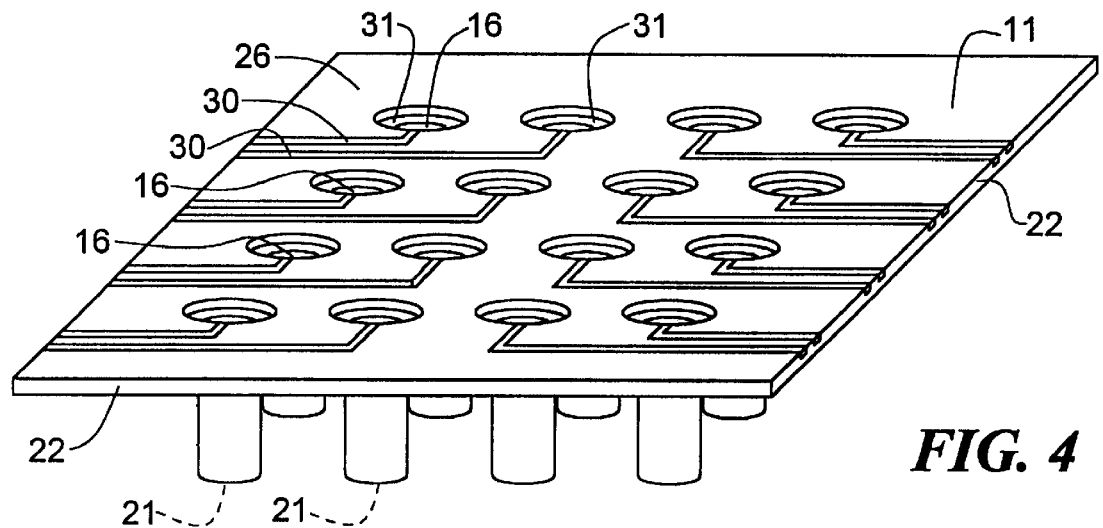
FIG. 4 is a perspective view of the ceramic body of FIG. 3 with portions of the conductive coating removed to isolate the electrodes and circuitry of the transducer from one another.

One example of such electrode patterning is illustrated in FIGS. 3 and 4, in which like features to those shown in FIG. 2 are indicated by the same reference numerals. Sintered ceramic body 11 is machined to form grooves 30 and, optionally, countersunk areas 31 in lower surface 26 of base 13. Alternatively, grooves 30 and countersunk areas 31 may be molded during fabrication of the ceramic body, by suitable shaping of the mold or mold insert. Body 11 is coated with electrically conductive coating 20 over the entire surface of the body, including inner surfaces 32 of tubes 12. Base lower surface 26 is then machined or ground to remove coating 20 from planar portion 33 of lower surface 26. At the same time, portions of coating 20 covering base outer edges 22 and tube upper edges 21 may also be machined or ground to remove coating 20 therefrom. The removal of coating 20 from base lower surface 26 leaves a conductive pattern in grooves 30 and, optionally, countersunk areas 31 which interconnect individual electrodes 16 on tube inner surfaces 32, or groups of individual electrodes 16, with a source of electrical power (not shown) in a conventional manner, e.g., via contacts and wires (not shown).

Referring again to FIG. 2, stiff cover plate 27 is bonded to tube upper edges 21 to extend across the upper surface of transducer 10. Cover plate 27 may be of any stiff material suitable for use in transducers, e.g., stiff metal, polymer, or polymer composite such as GRP circuit board material, and may be bonded to edges 21 by any suitable adhesive, as adhesive 28. However, the bonding material and cover plate must not interfere with the electrical isolation of electrodes 15 and 16 from one another. The preferred adhesive 28 is electrically insulating. In the case of a metal or other conductive cover plate, the lower surface of the cover plate may be provided with layer 29 of insulating material. The vibration of tube walls 17 drives cover plate 27, which, in turn, drives the desired medium, e.g., water.

Figure 5:
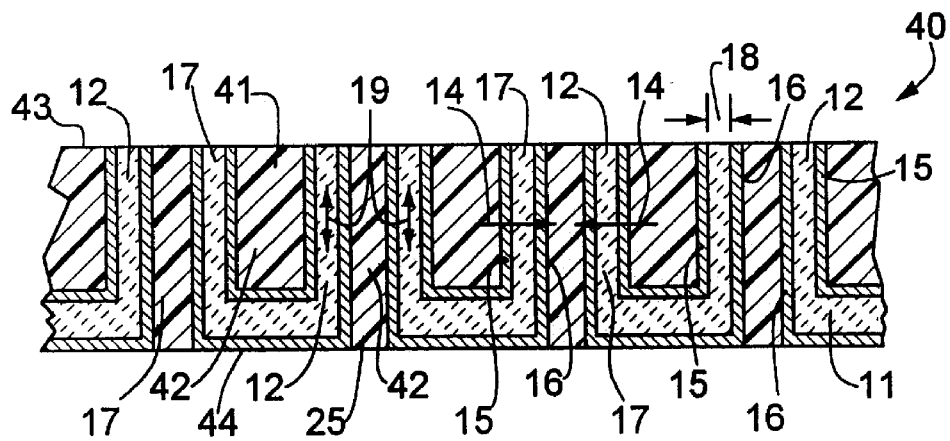
FIG. 5 is a cross sectional elevation view of a portion of a transducer in accordance with yet another embodiment of the invention.

FIG. 5 shows another illustrative transducer. Like features to those shown in the preceding Figures are indicated by the same reference numerals. Transducer 40 includes piezoelectric ceramic body 11, similar to the sintered ceramic body shown in FIGS. 1–4, made up of ceramic tubes 12 extending from ceramic base 13. Tubes 12 are poled, as shown by arrows 14, in a direction across the thickness of the tube walls. Electrodes 15 and 16 are provided on the outer and inner surfaces, respectively, of tube walls 17, as described for the transducer of FIG. 2, for driving the tube walls across their thickness 18, causing vibration in the tube walls in a direction normal to the plane of base 13, as shown by arrows 19, i.e., in the $d_{31}$ mode. Electrodes 15 and 16 are connected to a source of electrical power by conventional means.

Cylindrical openings 25 and troughs 41 between tubes 12 are filled, e.g., by casting, with stiff polymer 42, i.e., at least Shore D65 in stiffness to form with ceramic body 11 upper and lower continuous planar surfaces 43 and 44, respectively. Upper tube edges 21 and base lower surface 26 are exposed at planar surfaces 43 and 44 by polishing or grinding. Stiff polymer 42 is an electrically insulating polymer selected to bond securely to ceramic body 11 and may be, for example, a polyurethane or epoxy polymer.

On activation, the transducer is driven across the thickness of the tube walls, causing vibration in the tube walls in a direction normal to upper surface 43 of the transducer, as shown by arrows 19, i.e., in the $d_{31}$ mode. Because of the stiffness of the polymer and the bond between the polymer and the tube walls, polymer 42 is driven to vibrate with tube walls 17. Use of a cover plate similar to cover plate 27 of FIG. 2 is optional, since continuous upper planar surface 43 will drive the desired medium without the use of a cover plate.

Alternatively, polymer 42 may be a soft, compressible, electrically insulating elastomeric polymer, for example, a soft polyurethane or rubber, filling and surrounding the tubes for shock resistance. The polymer may include voids or be filled with air-filled microballoons to increase compressibility and the mechanical shock-absorbing capabilities of the polymer. In this case, a cover plate as is shown in FIG. 2 is required, since the polymer will not vibrate with tube walls 17.

Figure 7:
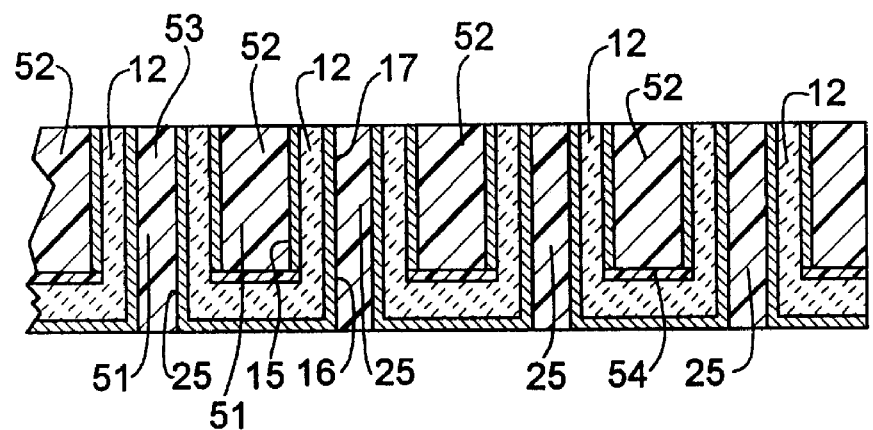
Figure 8:
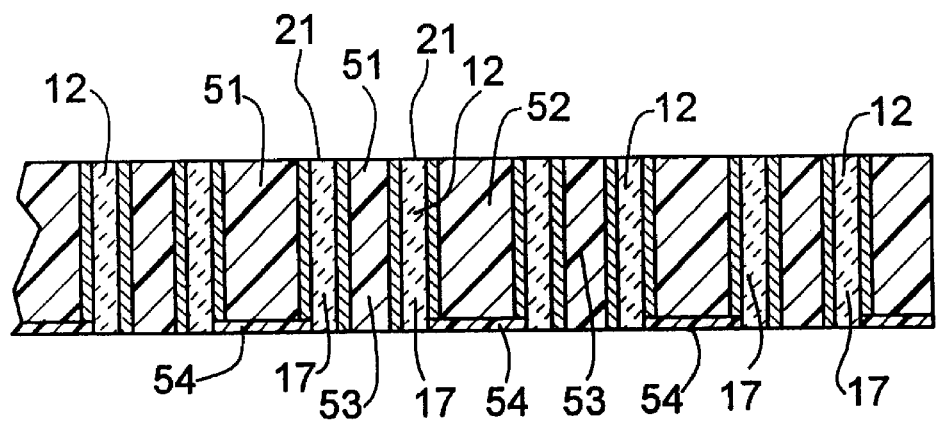
Figure 9:
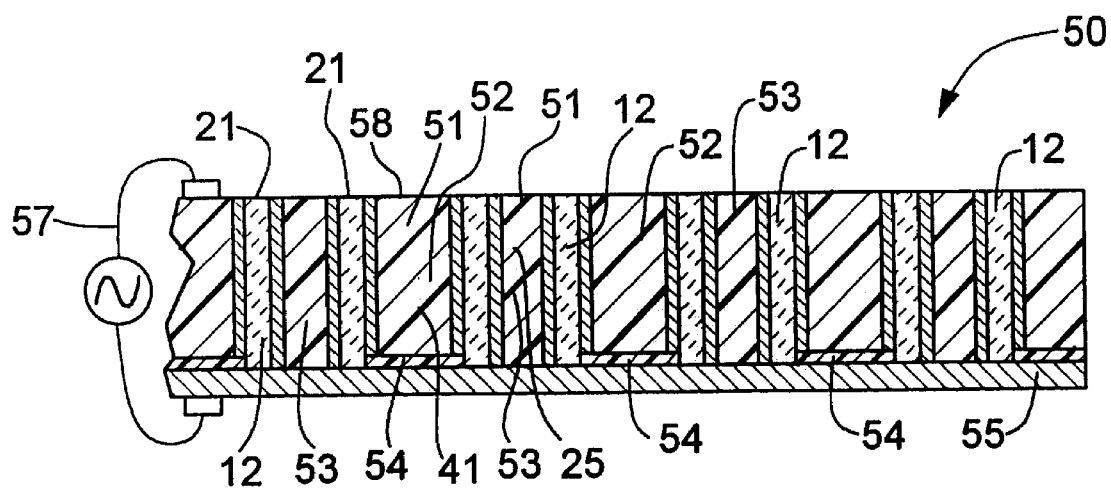

FIGS. 6–9 illustrate steps in the fabrication of still another illustrative transducer, transducer 50, shown in completed form in FIG. 9. In FIGS. 6–9, like features to those shown in previous Figures are indicated by the same reference numerals. Transducer 50 is similar to transducer 40 shown in FIG. 5 in that cylindrical tube openings 25 and troughs 41 between tubes 12 are polymer filled. However, in transducer 50, stiff polymer 51 is a conductive polymer, of at least Shore D65, that cooperates with outer and inner electrodes 15 and 16 to provide outer and inner electrodes 52 and 53, respectively. Layer 54 of an insulating polymer cooperates with exposed tube upper edges 21 to isolate inner and outer electrodes 52 and 53 from one another. Transducer 50 also differs from transducer 40 in that base 13 has been removed, the electrodes of transducer 50 being connected to a source of electrical power by a circuit board or by conductive layer 55, which is similar to the portion of conductive layer 20 covering base lower surface 26, as shown in FIG. 2.

Figure 6:
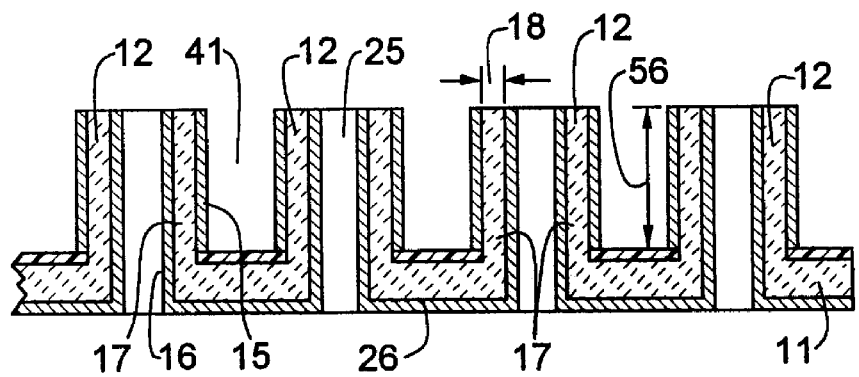
FIGS. 6–9 are sectional elevation views of steps in the fabrication of a transducer in accordance with still another embodiment of the invention.

FIG. 6 shows sintered piezoelectric ceramic body 11, which is similar to the sintered ceramic body shown in FIGS. 1–5. Body 11 is made up of ceramic tubes 12 extending from ceramic base 13. In the body shown in FIG. 6, cylindrical tube openings 25 extend through base 13 to base lower surface 26. In this embodiment, however, this is optional. It is sufficient that openings 25 extend through the tubes to a depth coplanar with the interface of insulating layer 54 and base 13. Insulating layer 54 is deposited on base 13 to cover the bottom of troughs 41 between tubes 12, e.g., by casting an insulating polymer into the troughs. The thickness of insulating layer 54 is preferably 0.5–5 times the tube wall thickness 18, or 0.1–0.3 times the effective tube wall height 56, i.e., the height of the tube wall above base 13. Optionally, after deposition of the insulating layer, electrodes 15 and 16 may be added to the ceramic body-insulating layer composite in a manner similar to the coating step described for transducer 10. Tubes 12 then may be poled, as shown by arrows 14, in a direction across the thickness 18 of tube walls 17. Alternatively, poling may be carried out at a later stage in the fabrication process, as described below. Electrodes 15 and 16 are not necessary to the operation of transducer 50, and are optional if poling is not carried out at this stage in the fabrication process.

As shown in FIG. 7, cylindrical openings 25 and troughs 41 between tubes 12 are filled with stiff electrically conductive polymer 51. Conductive polymer 51, alone or with electrodes 15 and 16, provides electrodes 52 and 53. Electrodes 52 and 53 contact the outer and inner surfaces, respectively, of tube walls 17 for activating the transducer, as described for electrodes 15 and 16 of the transducer of FIG. 2. Preferably, polymer 51 bonds securely to tube walls 17 or to electrodes 15 and 16, if present. Suitable conductive polymers 51 include silver-, nickel-, and carbon-filled epoxy resins, or other known conductive polymers. A thermoplastic conductive polymer is preferred for some applications, since heating the transducer to the polymer softening temperature can render the transducer conformal to non-planar surfaces.

As shown in FIG. 8, base 13 and a portion of electrode 53 are ground away to expose, but not remove insulating layer 54, leaving tube walls 17 supported only by electrodes 52 and 53. Upper surface 58 of the transducer is polished or ground to expose tube upper edges 21. Thus, insulating layer 54 cooperates with exposed tube upper edges 21 to isolate outer and inner electrodes 52 and 53 from one another. Electrodes 52 and 53 may then readily be electrically connected to a source of electric power. At this point in the process, the ceramic body may be poled, if this has not previously been accomplished.

FIG. 9 illustrates one convenient way of powering transducer 50. Conductive layer 55 is applied to the entire lower surface of the transducer to electrically contact electrodes 53. Electrode 52 is electrically isolated from conductive layer 55 by insulating layer 54. Thus, layer 55 is similar to the portion of conductive layer 20 covering base lower surface 26 of FIG. 2. Electrodes 52 and 53 of transducer 50 are connected to a source of electrical power by, e.g., means 57 which is similar to that described for the transducer of FIG. 2 Alternatively, a patterned circuit board or a patterned layer similar to that shown in FIG. 4 may be used to drive individual tubes or groups of tubes independently of one another. Transducer 50 is driven across the tube wall thickness 18, causing vibration in the tube walls in a direction normal to the plane of base 13, as shown by arrows 19, i.e., in the $d_{31}$ mode. Use of a cover plate similar to cover plate 27 of FIG. 2 is optional, since continuous upper planar surface 58 will drive the desired medium without the use of a cover plate. Transducer 50 operates at low voltage because it is driven across a very small tube wall thickness. Because the base is removed, this embodiment is lighter in weight and less fragile than the other described embodiments, and may be rendered conformal as described above, while retaining the same ease of electroding and reasonable cost of manufacture.

The devices and methods described herein provide low voltage transducers which are readily fabricated at reasonable cost, are rugged, and may be made rugged, conformal and/or lightweight to meet a variety of applications.

While there has been shown and described what are at present considered the preferred embodiments of the invention, it will be apparent to those skilled in the art that modifications and changes can be made therein without departing from the scope of the present invention as defined by the appended Claims.

We claim:

1. A transducer comprising a composite body having an upper generally planar surface and a lower generally planar surface, said composite body comprising:
   a ceramic body comprising a base having a lower surface, and an array of parallel, hollow, tube-shaped ceramic transducer elements of a strongly piezoelectric or electrostrictive ceramic material, wherein said tube-shaped elements are integral with and extend perpendicularly from said base, are fixedly supported in said array by said base, and have tube walls each having an outer surface, an inner surface, and an upper edge;
   a first electrically conductive electrode contacting said tube wall inner surface;
   a second electrically conductive electrode contacting said tube wall outer surface and electrically isolated from said first electrode and from said base lower surface;
   wherein said first electrode extends onto said base lower surface for electrical connection to a source of electric power for driving said transducer across said tube walls for $d_{31}$ mode vibration of said tube walls.

2. A transducer in accordance with claim 1 further comprising a cover plate extending over said body upper surface and bonded to said wall upper surfaces for transmitting vibration of said tube walls to a desired medium.

3. A transducer in accordance with claim 1 wherein said first and second electrodes are provided by an electrically conductive coating covering all surfaces of said ceramic body except said upper edges of said tube walls and outer edges of said base, said coating-free tube wall upper edges and base outer edges serving to electrically isolate said first and second electrodes from one another.

4. A transducer in accordance with claim 1 wherein said first electrode is electrically patterned at said base lower surface to provide electrical circuitry for connecting individual ones of said tube-shaped elements or groups of said tube-shaped elements to a source of electrical power to be driven independently of others of said elements or groups of elements.

5. A transducer in accordance with claim 1 further comprising a matrix of a stiff electrically insulating polymer filling said tube-shaped elements and troughs between said elements and bonded to said elements, an upper surface of said matrix being coplanar with said tube wall upper edges to provide said composite body upper surface for transmitting vibration of said tube walls to a desired medium.

6. A transducer in accordance with claim 2 further comprising a matrix of a soft, compressible, electrically insulating elastomeric polymer filling said tube-shaped elements and troughs between said elements and bonded to said elements, to provide mechanical shock resistance to said transducer.

7. A transducer comprising a composite body having an upper generally planar surface and a lower generally planar surface, said composite body comprising:
   an array of parallel, hollow, tube-shaped ceramic transducer elements of a strongly piezoelectric or electrostrictive ceramic material, wherein said tube-shaped elements have tube walls each having an outer surface, an inner surface, and an upper edge;
   a first electrically conductive electrode contacting said tube wall inner surface;
   a second electrically conductive electrode contacting said tube wall outer surface; and
   an electrically insulating layer at said composite body lower surface between said elements, said insulating layer and said tube wall upper edges serving to electrically isolate said second electrode from said first electrode and said composite body lower surface;
   wherein said first and second electrodes are provided by a stiff, electrically conductive polymer matrix filling said tube-shaped elements and spaces between said elements and bonded to said elements, an upper surface of said matrix being coplanar with said tube wall upper edges to provide said composite body upper surface for transmitting vibration of said tube walls to a desired medium, and said tube wall upper edges being exposed at said composite body upper surface; and wherein said first electrode extends onto said composite body lower surface for electrical connection to a source of electric power for driving said transducer across said tube walls for $d_{31}$ mode vibration of said tube walls.

8. A transducer in accordance with claim 7 wherein said first electrode includes an electrically conductive coating covering said composite body lower surface.

9. A transducer in accordance with claim 7 wherein said first electrode is electrically patterned at said composite body lower surface to provide electrical circuitry for connecting individual ones of said tube-shaped elements or groups of said tube-shaped elements to a source of electrical power to be driven independently of others of said elements or groups of elements.

\* \* \* \* \*